United States Patent
Takagi et al.

(10) Patent No.: US 7,567,002 B2
(45) Date of Patent: Jul. 28, 2009

(54) BOARD MOUNTED STRUCTURE OF VIBRATION MOTOR

(75) Inventors: Takahiro Takagi, Ueda (JP); Masato Nakamura, Ueda (JP)

(73) Assignees: Sanyo Electric Co., Ltd., Moriguchi-shi (JP); Sanyo Seimitsu Co., Ltd., Ueda-shi (JP)

( * ) Notice: Subject to any disclaimer, the term of this patent is extended or adjusted under 35 U.S.C. 154(b) by 0 days.

(21) Appl. No.: 12/140,417

(22) Filed: Jun. 17, 2008

(65) Prior Publication Data

US 2009/0039721 A1    Feb. 12, 2009

(30) Foreign Application Priority Data

Aug. 6, 2007    (JP)    ............... 2007-204120

(51) Int. Cl.
*H02K 7/065* (2006.01)
*B06B 1/16* (2006.01)

(52) U.S. Cl. .................. 310/81; 310/71

(58) Field of Classification Search .......... 310/71, 310/81
See application file for complete search history.

(56) References Cited

U.S. PATENT DOCUMENTS

| | | | | |
|---|---|---|---|---|
| 5,835,006 A | * | 11/1998 | Michalak et al. | 340/407.1 |
| 5,986,367 A | * | 11/1999 | Tsuzaki et al. | 310/71 |
| 6,081,055 A | * | 6/2000 | Narusawa | 310/81 |
| 7,084,535 B2 | * | 8/2006 | Holman et al. | 310/81 |
| D534,121 S | * | 12/2006 | Morita et al. | D13/112 |
| 2007/0085495 A1 | * | 4/2007 | Suzuki et al. | 318/128 |
| 2007/0241626 A1 | * | 10/2007 | Suzuki et al. | 310/71 |
| 2008/0309180 A1 | * | 12/2008 | Suzuki et al. | 310/81 |

FOREIGN PATENT DOCUMENTS

| | | | | |
|---|---|---|---|---|
| JP | 3004537 | | * | 9/1994 |
| JP | 11-226501 | A | * | 8/1999 |
| JP | 2001-178073 | A | * | 6/2001 |
| JP | 2002-044907 | A | * | 2/2002 |
| JP | 2002-176745 | | * | 6/2002 |
| JP | 2004-215344 | | * | 7/2004 |
| JP | 2005-124364 | A | * | 5/2005 |

(Continued)

*Primary Examiner*—Burton Mullins
(74) *Attorney, Agent, or Firm*—Kratz, Quintos & Hanson, LLP (57) ABSTRACT

A board mounted structure of a vibration motor which self aligns along with melting of cream solder even if deviation occurs in positioning of the flat bottom surface of a metal holder frame and a fastening pattern at the time of automatic mounting, that is, a board mounted structure having a vibration motor having a metal holder frame into which a motor case is fit and a pair of external terminal pieces attached to a plastic end cap and a printed circuit board having a fastening pattern shaped left-right symmetric about a center line and superposed with a bottom surface of the metal holder frame and power feed patterns adjoining this fastening pattern, arranged left-right symmetrical with respect to a center line, and superposed with corresponding external terminal pieces, the metal holder frame having front projecting pieces and a back projecting piece at its flat bottom surface, the fastening pattern having front extending pattern surfaces superposed with corresponding front projecting pieces and a back extending pattern surface superposed with the back projecting piece at its main fastening pattern surface.

2 Claims, 8 Drawing Sheets

FOREIGN PATENT DOCUMENTS

| | | | |
|---|---|---|---|
| JP | 2006-101659 A | * | 4/2006 |
| JP | 2006-288010 | * | 10/2006 |
| WO | 97-40568 | * | 10/1997 |
| WO | 99-41020 | * | 8/1998 |
| WO | 2005-064770 | * | 7/2005 |
| WO | 2005-099067 | * | 10/2005 |
| WO | 2006-016518 | * | 2/2006 |

* cited by examiner

BOARD MOUNTED STRUCTURE OF VIBRATION MOTOR

BACKGROUND OF THE INVENTION

1. Field of the Invention

This application is based upon and claims a priority of Japanese Patent. Application No. 2007-204120, filed Aug. 6, 2007, the contents being incorporated herein by reference.

The present invention relates to the surface mounting of a vibration motor on a printed circuit board by reflow soldering.

2. Description of the Related Art

As a vibration motor of a structure suitable for surface mounting on a printed circuit board, for example, as disclosed in Japanese Patent. Publication No. 11-234943-A, there is known one having a vibration motor body attaching an eccentric weight to one end of a motor shaft, a metal holder frame provided with a motor holding part holding this vibration motor body by engagement with a motor case, and a pair of external terminal pieces attached to a plastic end cap (end bracket) sealing the opening of the motor case on the side opposite to the eccentric weight, wherein a flat bottom surface of the metal holder frame and the pair of external terminal pieces are fastened to a fastening pattern and a pair of power feed patterns of a printed circuit board by coating them with cream solder, bringing them into close contact, and reflow soldering them.

However, the above vibration motor had the following problems.

(1) In automatic mounting picking up a vibration motor and mounting it on a printed circuit board, a certain amount of deviation occurs in the positioning between the flat bottom surface of a metal holder frame and the fastening pattern or the pair of external terminal pieces and the pair of power feed patterns. In the process of melting, then cooling the cream solder for fastening by loading in an electric furnace, sometimes the axial line of the motor (center line of flat bottom surface) and center line of the fastening pattern will not be aligned and a drop in the yield will be incurred.

(2) If raising the fastening strength of the vibration motor on a printed circuit board by providing a raised bottom recess in the flat bottom surface and forming a solder reservoir there for fastening, the bottom surface of the motor case of the vibration motor will abut against the top surface of this raised bottom recess, so the degree of parallelism of the vibration motor body with respect to the flat bottom surface and fastening pattern is liable to become off.

SUMMARY OF THE INVENTION

Therefore, in consideration of the above problems, a first object of the present invention is to provide a board mounted structure of a vibration motor wherein even if a certain extent of deviation occurs in positioning between a flat bottom surface of a metal holder frame and a fastening pattern by automatic mounting, alignment of a center line of the flat bottom surface and a center line of the fastening pattern is possible by self alignment by melting of cream solder.

A second object of the present invention is to provide a board mounted structure of a vibration motor enabling improvement of the degree of parallelism of the vibration motor with respect to a flat bottom surface even when providing a raised bottom recess in the flat bottom surface and forming a solder reservoir there for fastening.

To solve the above problem, the present invention provides a board mounted structure of a vibration motor comprised of a vibration motor having a vibration motor body attaching an eccentric weight to a motor shaft projecting out from a motor case, a metal holder frame provided with a motor holding part in which said motor case is fit and held, and a pair of external terminal pieces attached to a plastic end cap sealing an opening of said motor case at the opposite side of the eccentric weight and a printed circuit board having a fastening pattern shaped left-right symmetric about a center line and superposed with a flat bottom surface of said metal holder frame and a pair of power feed patterns adjoining a back edge of this fastening pattern, arranged left-right symmetric about said center line, and superposed with the pair of external terminal pieces, wherein said metal holder frame has a pair of front projecting pieces projecting from the front edge of said flat bottom surface out to the front and a back projecting piece projecting from the back edge of said flat bottom surface out to the back, and said fastening pattern has a pair of front extending pattern surfaces extending from a main fastening pattern surface, arranged left-right symmetrical about said center line, and superposed with said pair of front projecting pieces and a back extending pattern surface extending from said main fastening pattern surface along said center line to between said pair of power feed patterns and superposed with said back projecting piece.

When setting a vibration motor by automatic mounting on a printed circuit board with a fastening pattern and power feed patterns coated with cream solder, a certain degree of deviation will occur in the positioning between the flat bottom surface of the metal holder frame and the fastening pattern or the external terminal pieces and the pair of power feed patterns. In the molten state of cream solder due to loading in an electric furnace, a force component of the surface tension due to the molten solder acts to pull toward the center line not only at the superposed part between the flat bottom surface and main fastening pattern surface, the superposed part between the pair of front projecting pieces and the pair of front extending pattern surfaces, and the superposed part between the pair of external terminal pieces and the pair of power feed patterns, but also the superposed part between the back projecting piece and the back extending pattern surface entering between the pair of power feed patterns, so alignment of the center line of the flat bottom surface and center line of the fastening pattern by self alignment becomes easy, deviation of positioning can be suppressed, and the yield is improved.

Further, the metal holder frame has a raised bottom recess formed in a flat bottom surface and a support part formed by bending the front end of the back projecting piece. The top surface of the raised bottom recess, the top surface of the support part, and the bottom surface of the motor case preferably are formed abutting against each other. This support part can enter between the pair of external terminal pieces and support the motor case at the end cap side, so the degree of parallelism of the motor axial line of the vibration motor body with the flat bottom surface of the metal holder frame and the fastening pattern of the printed circuit board can be improved.

BRIEF DESCRIPTION OF THE DRAWINGS

These and other objects and features of the present invention will become clearer from the following description of the preferred embodiments given with reference to the attached drawings, wherein:

FIG. 5A is a front view showing a metal holder frame of the vibration motor, while FIG. 6A is a plan view of the same metal holder frame, while FIG. 7A is a right side view of the metal holder frame, while FIG. 8A is a perspective view of the holder frame seen from the back, while

DESCRIPTION OF THE PREFERRED EMBODIMENTS

Figure 1:
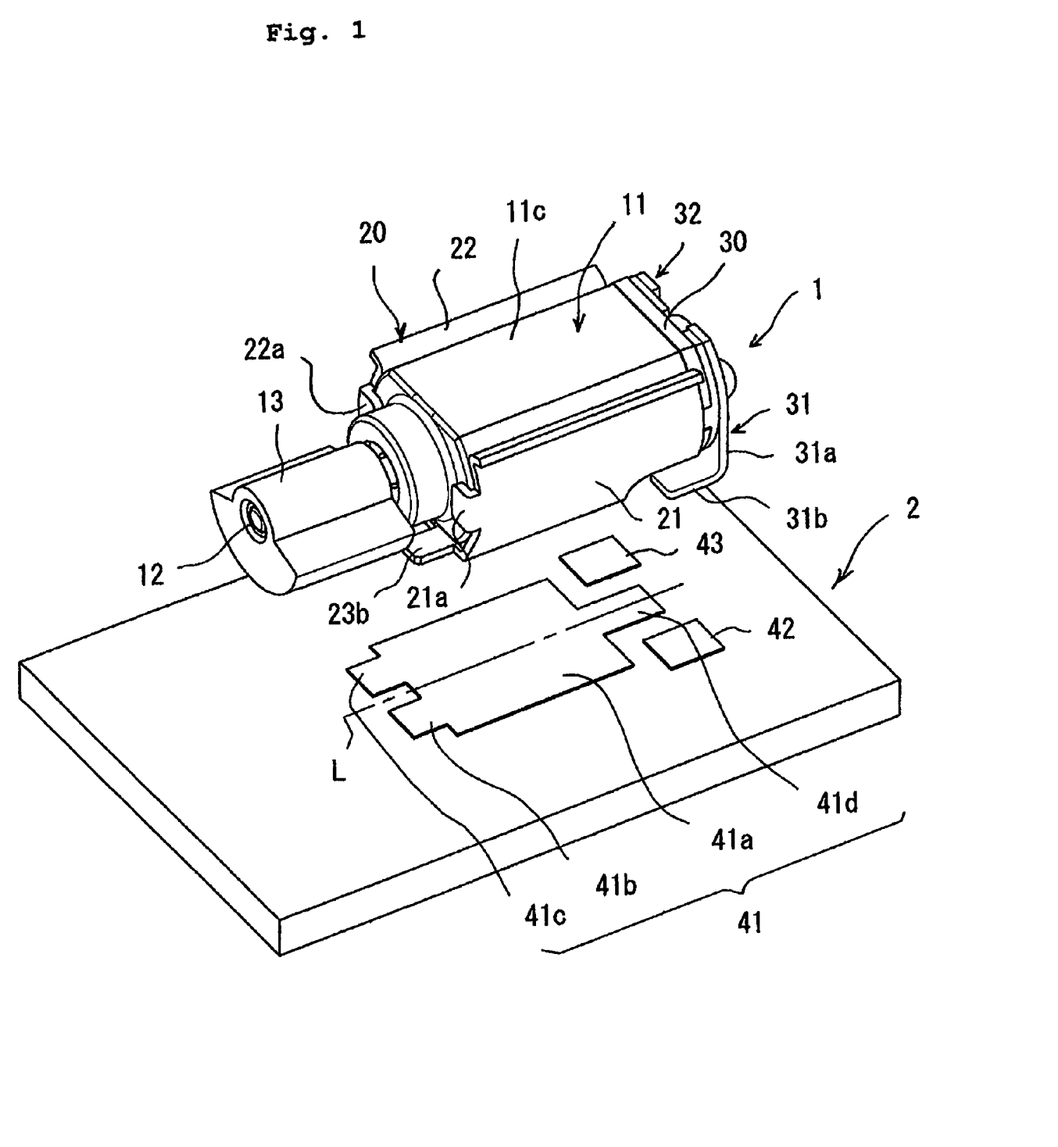
FIG. 1 is a perspective view showing the state of mounting a vibration motor according to an embodiment of the present invention on a printed circuit board.
Figure 2A:
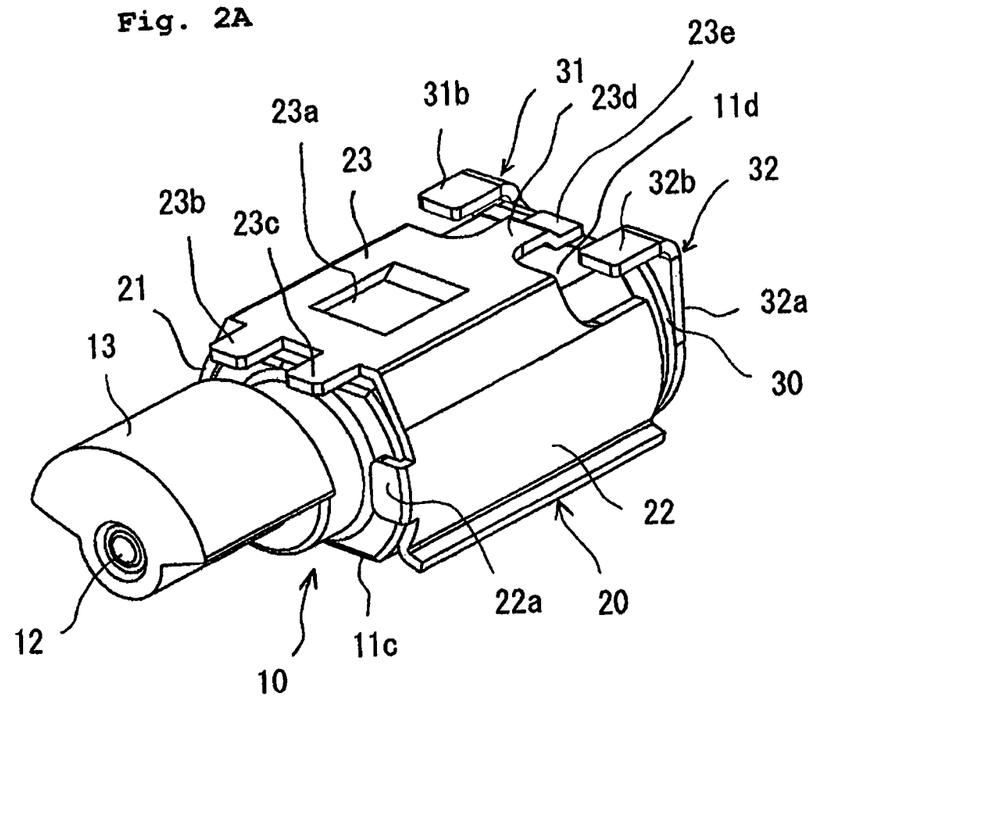
FIG. 2A is a perspective view showing the state when viewing the vibration motor from the back.
Figure 2B:
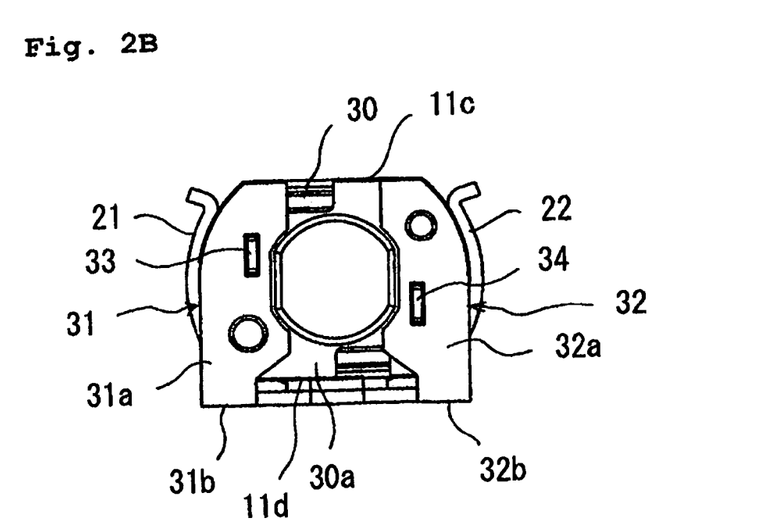
FIG. 2B is a back view showing the side of the vibration motor at the opposite side of the eccentric weight.
Figure 3:
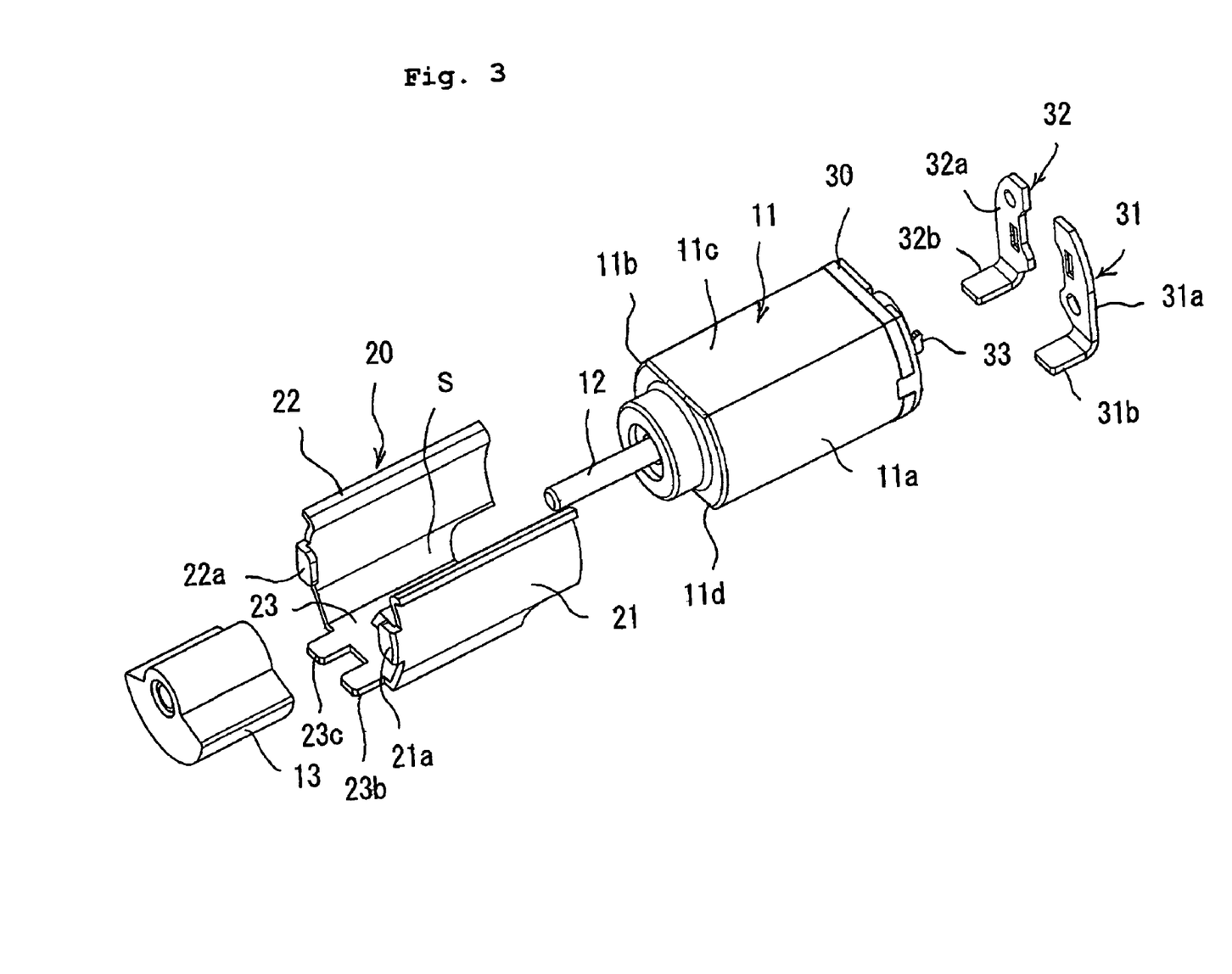
FIG. 3 is a disassembled perspective view of the vibration motor.
Figure 4:
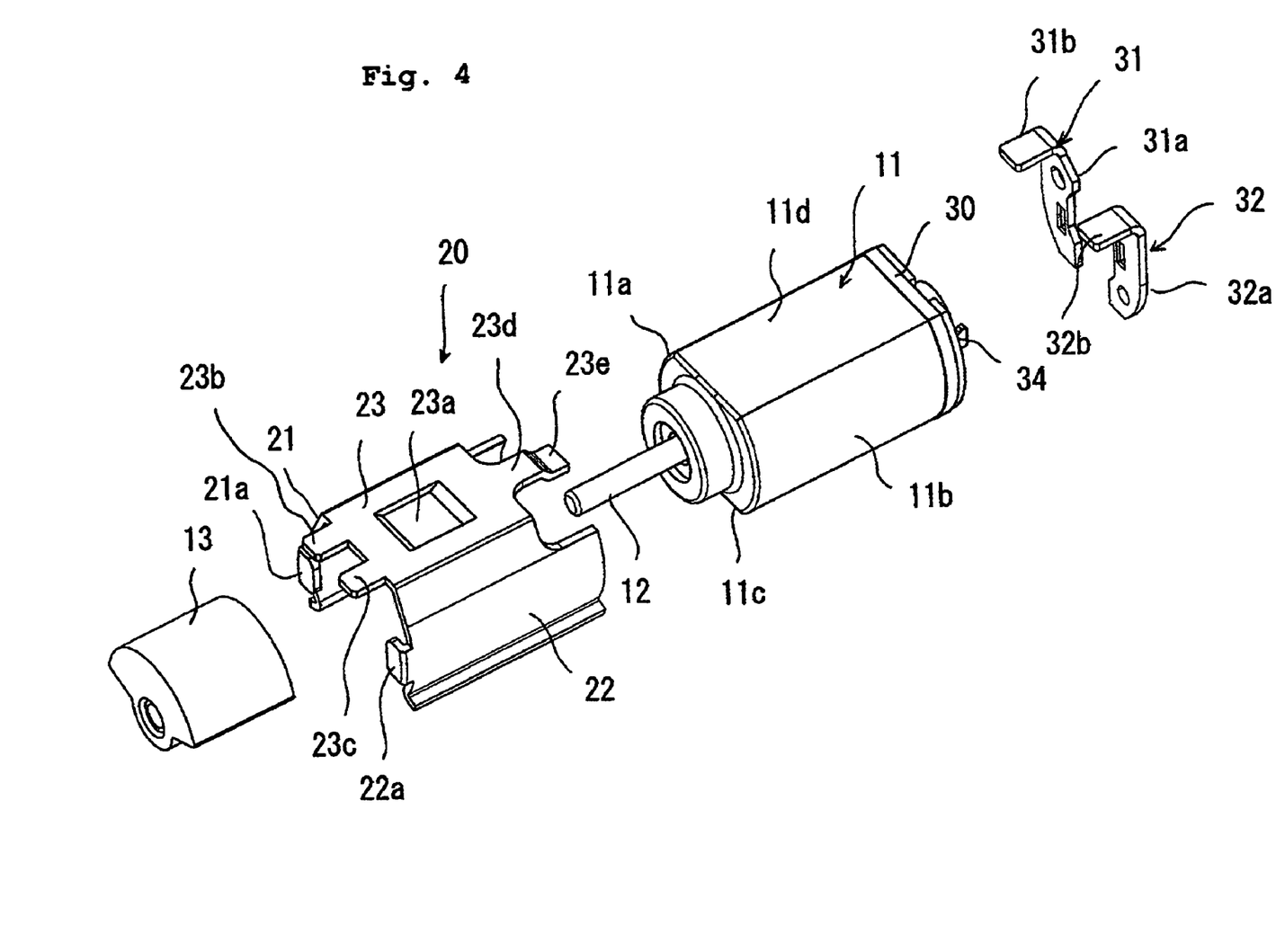
FIG. 4 is a disassembled perspective view of the vibration motor seen from the back.
Figure 5A:
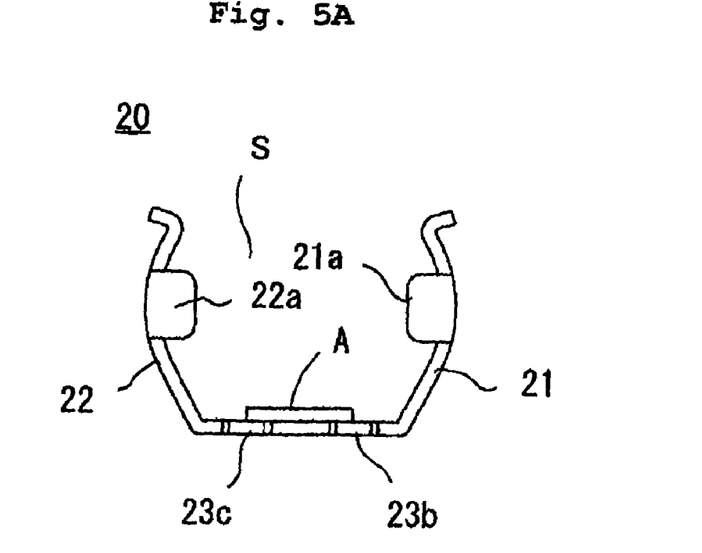
Figure 5B:
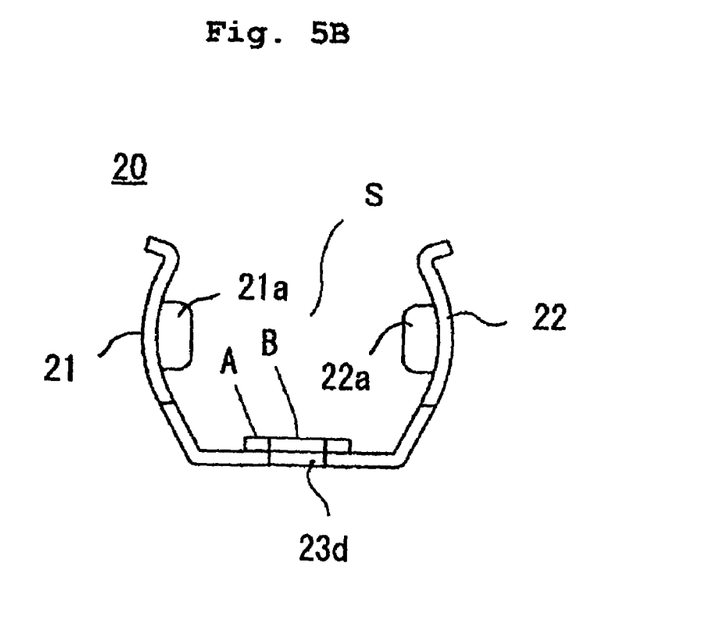
FIG. 5B is a back view of the same.
Figure 6A:
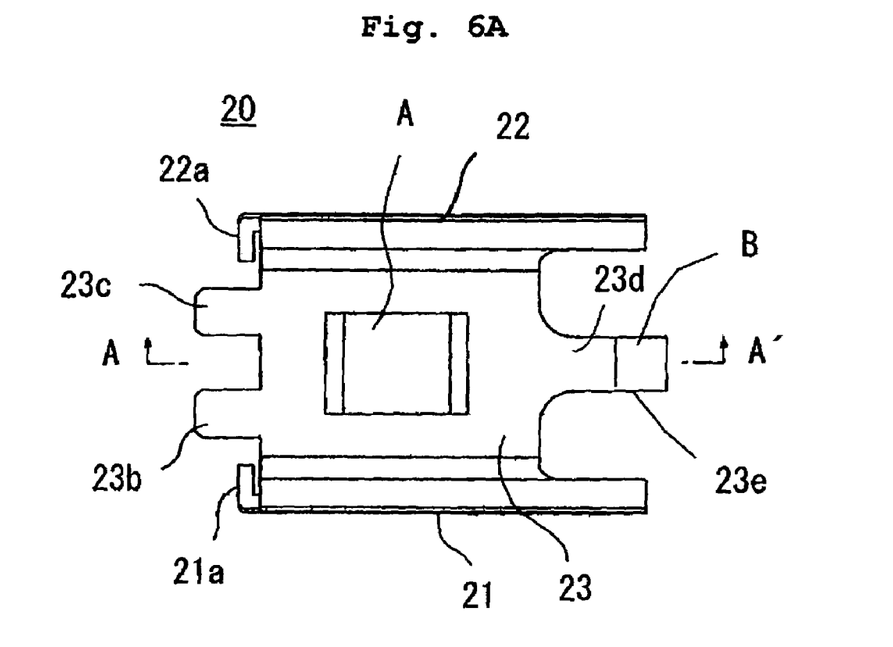
Figure 6B:
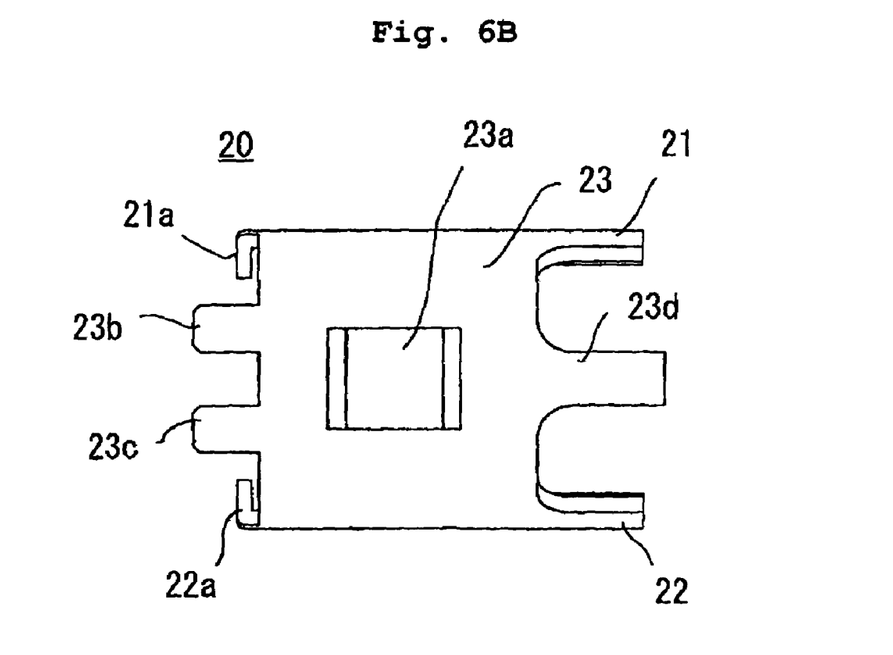
FIG. 6B is a bottom view of the same.
Figure 7A:
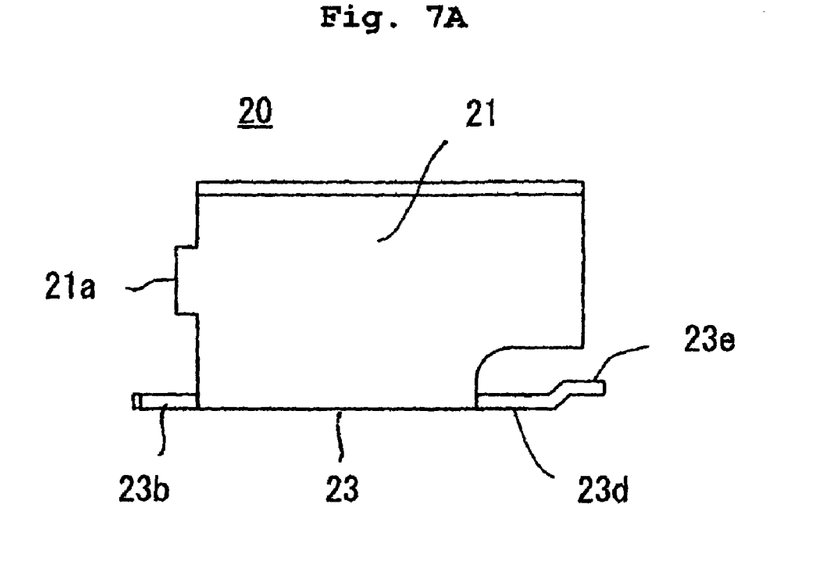
Figure 7B:
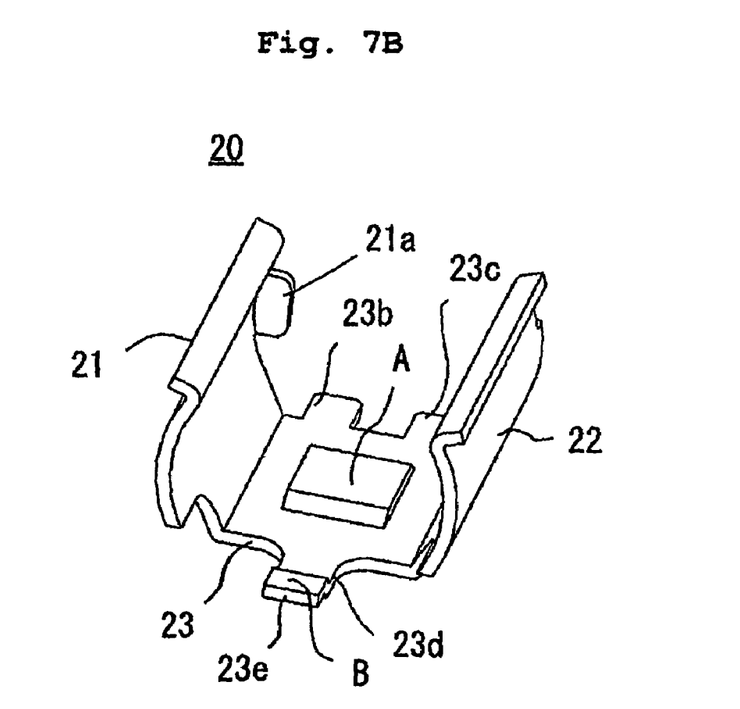
FIG. 7B is a perspective view of the same.

FIG. 1 is a perspective view showing the state of mounting a vibration motor according to an embodiment of the present invention on a printed circuit board, FIG. 2A is a perspective view showing the state when viewing the vibration motor from the back, FIG. 2B is a back view showing the side of the vibration motor at the opposite side of the eccentric weight, FIG. 3 is a disassembled perspective view of the vibration motor, and FIG. 4 is a disassembled perspective view of the vibration motor seen from the back.

The vibration motor 1 of this example, as shown in FIG. 1 to FIG. 4, has a vibration motor body 10 attaching an eccentric weight 13 to a motor shaft 12 projecting out from a small sized motor case 11; a metal holder frame 20 provided with a motor holding part S in which curved side surfaces 11a, 11b of the motor case 11 are held by clamping plates 21, 20; and a pair of external terminal pieces 31, 32 attached to a plastic end cap (end bracket) 30 sealing the opening of the motor case 11 at the side opposite to the eccentric weight. This small sized motor case 11 is provided with a flat top surface 11c and bottom surface 11d for facilitating suction and pickup at the time of automatic mounting. The pair of external terminal pieces 31, 32 are bent into L-shapes and have connecting pieces 31a, 32a connected to the end face 30a of the plastic end cap 30 and soldered to the motor terminals 33, 34 conductive with the brush unit (not shown) in the motor case 11 and connecting pieces 31b, 32b facing the bottom surface 11d of the motor case 11 a distance away.

The metal holder frame 20 has elastic clamping plates 21, 22 formed integrally from the flat bottom surface 23 by bending from the two sides. At the front edges of the clamping plates 21, 22, stopper pieces 21a, 22a positioning the axial direction of the motor case 11 at the motor holding part S are integrally formed. Inside the flat bottom surface 23, a rectangular raised bottom recess 23a for securing a solder reservoir is formed. The pair of front projecting pieces 23b, 23c project out from the front edge of this flat bottom surface 23 in the same plane, the back projecting piece 23d projects out from the center of the back edge of the flat bottom surface 23 in the same plane, and the front end of this back projecting piece 23d is bent to form a support part 23a abutting against the bottom surface 11d of the motor case 11.

On the other hand, the printed circuit board 2 mounting the above vibration motor 1, as shown in FIG. 1, has a fastening pattern 41 shaped left-right symmetric about the center line L and superposed with the flat bottom surface 23 of the metal holder frame 20 and a pair of power feed patterns 42, 43 adjoining the back edge of this fastening pattern 41, arranged left-right symmetric with respect to the center line L, and superposed with the connecting pieces 31b, 32b. The fastening pattern 41 has a pair of front extending pattern surfaces 41b, 41c extending from the front edge of the four-sided main fastening pattern surface 41a, arranged left-right symmetric about the center line L and superposed with the pair of front projecting pieces 23b, 23c and a back extending pattern surface 41d extending from the back edge of the main fastening pattern surface 41a along the center line L to between a pair of power feed patterns 42, 43 and superposed with the back projecting piece 23d.

Figure 8A:
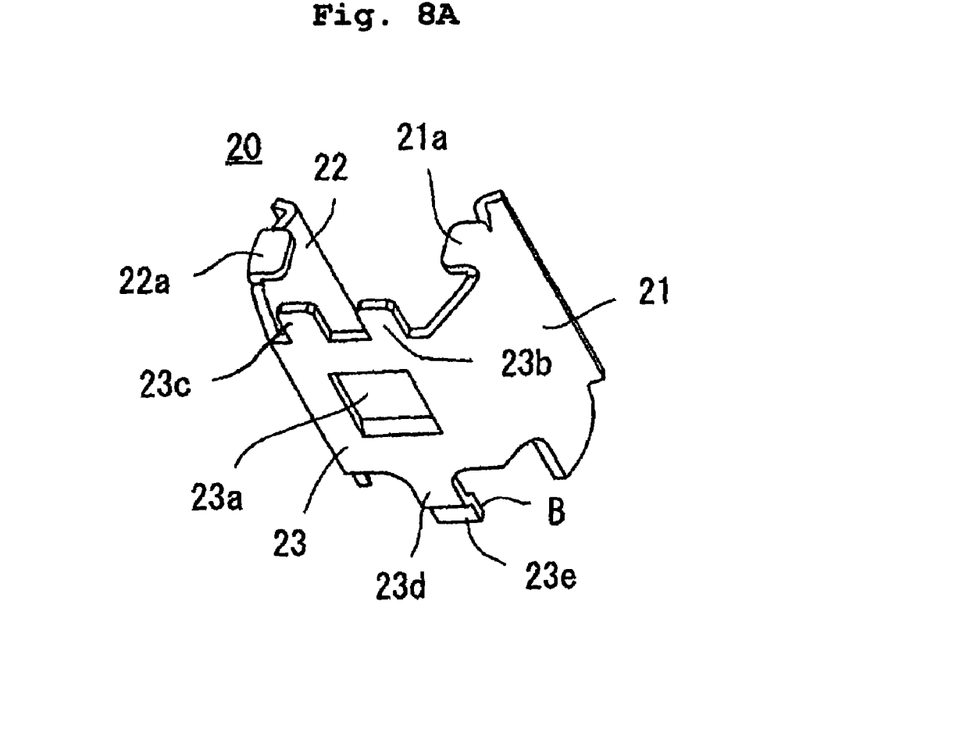
Figure 8B:
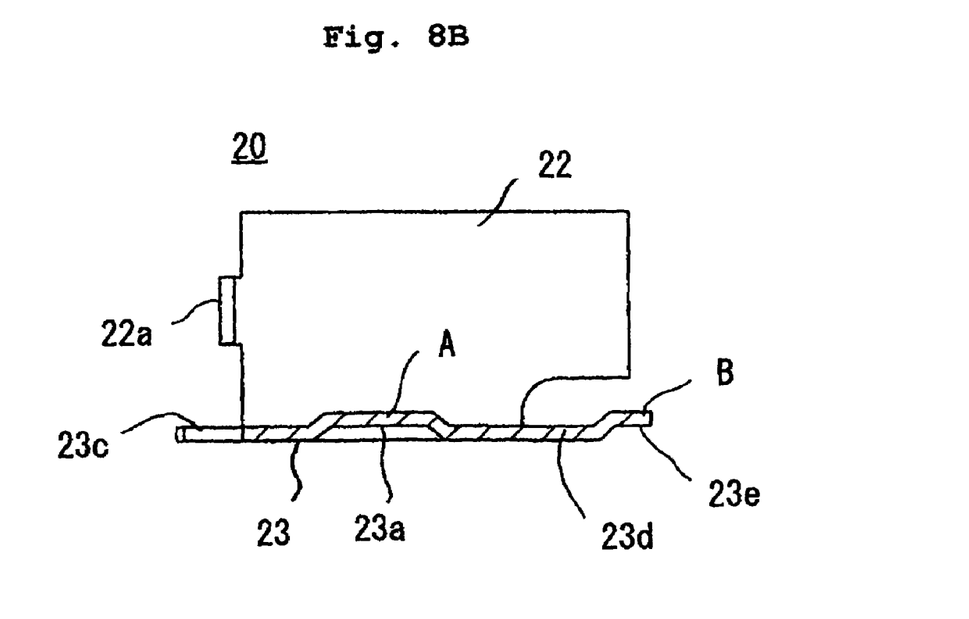
FIG. 8B is a cross-sectional view showing the state cut along the line A-A' in FIG. 6A.

The metal holder frame 20, as shown in FIG. 8B, has a raised bottom recess 23a formed in the flat bottom surface 23 and a support part 23e formed by bending the front end of the back projecting piece 23d. The top surface A of the raised bottom recess 23a and the top surface B of the support part 23e are arranged in the plane parallel to the flat bottom surface 23 and abut against the front and back parts of the center of the bottom surface 11d of the motor case 11.

In such a configuration of a board mounted structure, if placing the vibration motor 1 by automatic mounting on the printed circuit board 2 with the fastening pattern 41 and power feed patterns 42, 43 coated with cream solder (not shown), while a certain extent of deviation occurs in the positioning of the flat bottom surface 23 of the metal holder frame 20 and fastening pattern 41 or the connecting pieces 31b, 32b and the power feed patterns 42, 43, in the molten state of the cream solder resulting from loading into the electric furnace, the force component of the surface tension due to the molten solder acts to pull toward the center line L not only at the superposed part between the flat bottom surface 23 and main fastening pattern surface 41a, the superposed part between the pair of front projecting pieces 23b, 23c and pair of front extending pattern surfaces 41b, 41c, and the superposed part between the pair of connecting pieces 31b, 32b and the pair of power feed pattern 42, 43, but also at the superposed part between the back projecting piece 21d and the back extending pattern surface 41d extending between the pair of power feed patterns 42, 43, so alignment of the center line of the flat bottom surface 23 and the center line L of the fastening pattern 41 by self alignment becomes easier, deviation of positioning can be suppressed, and the yield is improved. The pair of front projecting pieces 23b, 23c are necessary for preventing the vibration motor 1 from falling over at the time of placement of the vibration motor 1 on the printed circuit board 2 due to the heaviness of the eccentric weight 13 and for securing the fastening area. The superposed part between the back projecting piece 23d and the back extending pattern surface 41d becomes a self-aligning force aligning the center line of the flat bottom surface 23 with the center line L of the fastening pattern 41 along with melting of the solder. Further, the fastening area can also be secured.

Here, at the front end side of the back projecting piece 23d, a support part 23e is formed by bending. Its top surface B enters between the pair of external terminal pieces 31, 32 and supports the motor case 11 at the end cap 30 side. For this reason, the distance between the top surface A of the raised bottom recess 23a against which the bottom surface 11d of the motor case 11 abuts and top surface B of the support part 23e becomes longer and the degree of parallelism between the motor axial line of the vibration motor body 10 and the flat bottom surface 23 of the metal holder frame 20 to the fastening pattern 41 of the printed circuit board 2 can be improved.

While the invention has been described with reference to specific embodiments chosen for purpose of illustration, it should be apparent that numerous modifications could be made thereto by those skilled in the art without departing from the basic concept and scope of the invention.

The invention claimed is:

1. A board mounted structure of a vibration motor comprising:

a vibration motor having a vibration motor body attaching an eccentric weight to a motor shaft projecting out from a motor case, a metal holder frame provided with a motor holding part in which said motor case is fit and held, and a pair of external terminal pieces attached to a plastic end cap sealing an opening of said motor case at the opposite side of the eccentric weight; and a printed circuit board having a fastening pattern shaped left-right symmetric about a center line and superposed with a flat bottom surface of said metal holder frame and a pair of power feed patterns adjoining a back edge of this fastening pattern, arranged left-right symmetric about said center line, and superposed with the pair of external terminal pieces; wherein said metal holder frame has a pair of front projecting pieces projecting from the front edge of said flat bottom surface out to the front and a back projecting piece projecting from the back edge of said flat bottom surface out to the back; and said fastening pattern has a pair of front extending pattern surfaces extending from a main fastening pattern surface, arranged left-right symmetrical about said center line, and superposed with said pair of front projecting pieces and a back extending pattern surface extending from said main fastening pattern surface along said center line to between said pair of power feed patterns and superposed with said back projecting piece.

2. A board mounted structure of a vibration motor as claimed in claim 1, wherein said metal holder frame has a raised bottom recess formed in said flat bottom surface and a support part formed by bending a front end side of said back projecting piece, a bottom surface of said motor case abutting against a top surface of said raised bottom recess and a top surface of said support part.

* * * * *